(12) United States Patent
Mehr et al.

(10) Patent No.: US 9,873,949 B2
(45) Date of Patent: Jan. 23, 2018

(54) METHOD AND DEVICE FOR PRODUCING NANOTIPS

(71) Applicant: IHP GmbH-Innovations for High Performance Microelectronics/Leibniz-Institut Fur Innovative Mikroelektronik, Frankfurt (DE)

(72) Inventors: Wolfgang Mehr, Friedersdorf (DE); Andre Wolff, Frankfurt (DE)

(73) Assignee: IHP GmbH—INNOVATIONS FOR HIGH PERFORMANCE MICROELECTRONICS/LEIBNIZ-INSTITUT FUR INNOVATIVE MIKROELEKTRONIK, Frankfurt (Oder) (DE)

( * ) Notice: Subject to any disclaimer, the term of this patent is extended or adjusted under 35 U.S.C. 154(b) by 0 days.

(21) Appl. No.: 14/897,769

(22) PCT Filed: Jun. 13, 2014

(86) PCT No.: PCT/EP2014/062462
§ 371 (c)(1),
(2) Date: Feb. 18, 2016

(87) PCT Pub. No.: WO2014/198944
PCT Pub. Date: Dec. 18, 2014

(65) Prior Publication Data
US 2016/0186333 A1   Jun. 30, 2016

(30) Foreign Application Priority Data
Jun. 14, 2013   (DE) .................. 10 2013 211 178

(51) Int. Cl.
*B44C 1/22*   (2006.01)
*C23F 4/00*   (2006.01)
(Continued)

(52) U.S. Cl.
CPC .............. *C23F 4/00* (2013.01); *B81C 1/00111* (2013.01); *C23C 16/50* (2013.01); *H01J 1/3044* (2013.01);
(Continued)

(58) Field of Classification Search
CPC ... H01J 2201/30411; H01J 2201/30415; H01J 2201/30419; C23C 16/0236
(Continued)

(56) References Cited

U.S. PATENT DOCUMENTS

| 4,968,382 A | 11/1990 | Jacobson et al. |
| 5,233,263 A | 8/1993 | Cronin et al. |

(Continued)

FOREIGN PATENT DOCUMENTS

| DE | 19501387 A1 | 8/1995 |
| EP | 1 267 380 A1 | 12/2002 |
| JP | 55062168 A | 5/1980 |

OTHER PUBLICATIONS

Wikipedia, The Free Encyclopedia, "Silicon" via https://en.wikipedia.org/wiki/Silicon ; pp. 1-15; 2017.*
(Continued)

*Primary Examiner* — Binh X Tran
(74) *Attorney, Agent, or Firm* — Ware, Fressola, Maguire & Barber LLP

(57) ABSTRACT

A method for producing a nanotip from a tip material provides a substrate which consists of the tip material or has the material in the form of a coating, produces a mask from a mask material selected so that, in a predefined reactive ion etching process, the mask material is removed at a lower etching rate than the tip material, and carries out the reactive ion etching process in an etching chamber. The mask material is additionally selected so that a gaseous component is released therefrom during the reactive ion etching process, (Continued)

the gaseous component not being released from the tip material. The method further comprises detecting the gaseous component while the ion etching process is being carried out, repeatedly determining whether an amount of the gaseous component in the etching chamber reaches a predefined lower threshold, and stopping the reactive ion etching process when the lower threshold is reached.

19 Claims, 4 Drawing Sheets

(51) Int. Cl.
  *H01J 37/073*  (2006.01)
  *H01J 1/304*  (2006.01)
  *H01J 9/02*  (2006.01)
  *H01J 37/32*  (2006.01)
  *B81C 1/00*  (2006.01)
  *C23C 16/50*  (2006.01)
  *H01L 21/3065*  (2006.01)
  *H01L 21/308*  (2006.01)

(52) U.S. Cl.
  CPC ............ *H01J 9/025* (2013.01); *H01J 37/073* (2013.01); *H01J 37/32963* (2013.01); *H01J 37/32981* (2013.01); *H01L 21/3065* (2013.01); *H01L 21/3081* (2013.01); *H01J 2201/30411* (2013.01); *H01J 2209/0226* (2013.01); *H01J 2237/334* (2013.01)

(58) Field of Classification Search
  USPC .................................. 216/11, 59, 67, 75, 79
  See application file for complete search history.

(56) References Cited

U.S. PATENT DOCUMENTS

| | | | |
|---|---|---|---|
| 5,312,514 A | 5/1994 | Kumar | |
| 5,607,602 A | 3/1997 | Su et al. | |
| 7,771,561 B2 | 8/2010 | Suzuki et al. | |
| 2001/0006321 A1 | 7/2001 | Choi et al. | |
| 2002/0195423 A1* | 12/2002 | Patel | B81C 1/00476 216/73 |
| 2003/0054723 A1* | 3/2003 | Choi | H01J 31/127 445/46 |
| 2011/0162703 A1* | 7/2011 | Adibi | H01L 31/02168 136/256 |

OTHER PUBLICATIONS

Wikipedia, The Free Encyclopedia; "Nickel" via https://en.wikipedia.org/wiki/Nickel ; pp. 1-16, 2017.*

Wikipedia, The Free Encyclopedia; "Cobalt" via https://en.wikipedia.org/wiki/Cobal ; pp. 1-16; 2017.*

Wikipedia, The Free Encyclopedia; "Iron" via https://en.wikipedia.org/wiki/Iron ; pp. 1-14; 2017.*

W. Mehr, et al.; "Ultra sharp crystalline silicon tip array used as field emitter"; Microelectronic Engineering, Bd. 30, Nr. 1-4; Jan. 1996; Elsevier Publishers; pp. 395-398.

Han, et al.; "AFM probes fabricated with masked-maskless combined anisotropic etching and p+ surface doping"; Institute of Physics Publishing; Journal of Micromechanics and Microengineering; Dec. 22, 2005; pp. 198-204.

* cited by examiner

- Prior Art-

METHOD AND DEVICE FOR PRODUCING NANOTIPS

CROSS REFERENCE TO RELATED APPLICATIONS

This application is the U.S. National Stage of International Application Number PCT/EP2014/062462 filed on Jun. 13, 2014, which application claims priority under 35USC §119 to German Patent Application No. 102013211178.9 filed on Jun. 14, 2013. Both applications are hereby incorporated by reference in their entirety.

TECHNICAL FIELD

The invention relates to a method and a device for producing nanotips.

BACKGROUND OF THE INVENTION

Components with nanotips, the tips of which have a radius of less than 10 nm, and more specifically of less than 1 nm, are used, inter alia, as field emission components in flat panel displays, high-performance microwave tubes, as quantum-effect components and as scanning tips in scanning electron microscopy. More recently, nanotips have also been used as part of biosensors.

There are various known methods for producing nanotips. One method known from U.S. Pat. No. 5,233,263 is to etch silicon in such a way, using a mask, that truncated cone are firstly produced. The outer surface of the truncated cone is then given a concave shape by an isotropic etching process. The tip is then formed by repeatedly oxidizing the truncated cone and removing the oxide layer. Alternatively, the tip can also be formed by sputtering a precious metal.

In order to avoid the oxidation step for sharpening the tip, DE 195 01 387 proposes that the tips be shaped by etching until a full undercut is achieved. FIG. 1 illustrates schematically the method described in DE 195 01 387. A mask 120 is used which is perfectly balanced on the apex of tips etched from substrate 110, even after full undercutting. A plasma dry etch process is continued until the mask has been fully undercut by the lateral etching process and a sharp silicon tip has been formed. Curved arrows in FIG. 1 illustrate the etching process when a plasma dry etch method is used.

Reactive ion etching (RIE) for producing nanotips is presented in the publication by W. Mehr et al. entitled "Ultra Sharp Crystalline Silicon Tip Array Used As Field Emitter" Microelectronic Engineering 30 (1996), pp. 395-398. The basis is a silicon wafer, on the surface of which an $SiO_2$ layer was thermally grown. Using a mask, the oxide layer is structured so that, for example, a circular oxide layer remains at the positions where the tips are desired. After removing the mask, the wafer is subjected to another RIE process. The etching process is then anisotropic. The different etching rates of $SiO_2$ and Si, in a ratio of approximately 1:5, are exploited. The etching process is continued until the mask has been entirely removed, then stopped. What remains is a sharp tip made of silicon.

SUMMARY OF THE INVENTION

According to a first aspect of the invention, a method for producing at least one nanotip from a tip material is specified, the method comprising the steps of:
providing a substrate which consists of the tip material or has said material in the form of a coating;
producing a mask from a mask material, wherein the mask material is selected so that, in a predefined reactive ion etching process, the mask material is removed at a lower etching rate than the tip material,
carrying out the reactive ion etching process in an etching chamber; the method further comprises the steps of
selecting the mask material such that a gaseous component is released from the mask material during the reactive ion etching process, said gaseous component not being released from the tip material during the reactive ion etching process,
detecting the gaseous component while the ion etching process is being carried out,
repeatedly determining during the ion etching process whether an amount of the gaseous component in the etching chamber reaches a predefined lower threshold, and
stopping the reactive ion etching process as soon as the lower threshold is reached.

The invention is based on the idea that optimizing the duration of the etching process is a problem in all known methods. If etching is too short in duration, a relatively large plateau remains on the truncated cone that forms during the etching process, which must then be sharpened in a further elaborate process, such as oxidizing. If etching lasts too long, a sharp tip is obtained, but one that becomes smaller and smaller the longer the etching process continues.

The invention is based on the realization that the duration of an RIE process which uses a mask can be optimized by stopping the RIE process at exactly the moment in which the mask has been completely removed and a sharp tip has formed for the first time. The invention is also based on the realization that said moment can be determined, provided that, during the process of etching the mask consisting of a mask material, a gaseous component is released which is not released in the process of etching the tip material, and which can be detected in the etching chamber. The moment the mask has been fully removed, the gaseous component is no longer released, and the moment in which the mask has been removed can therefore be determined by the absence of the gaseous component. The etching chamber is continuously evacuated, so that the reactive ion etching process can take place under controlled conditions in the high vacuum environment. The ion etching process is preferably carried out under high-vacuum conditions, i.e., under a pressure ranging between $10^{-3}$ and $10^{-7}$ hPa. The moment in which the mask is removed and the gaseous component is no longer released is substantially identical to the time at which the absence of the gaseous component is detected.

The concept of the invention is thus to specify the moment for stopping the RIE process in relation to the moment in which the amount of a specific gaseous component released when etching the mask material, but not when etching the tip material in the etching chamber, becomes less than an amount which is predefined as a lower threshold.

According to another aspect, the invention relates to a device for producing at least one nanotip, the device comprising
a system for reactive ion etching with an etching chamber,
a detection device for at least one gaseous component in the etching chamber, adapted to generate and output a signal containing information about an amount of the gaseous component currently present in the etching chamber, and
a controller which is connected to the detection device and the system for reactive ion etching and which is adapted to start, maintain and stop a reactive ion etching process in the etching chamber, to compare the information received from the detection device about the current amount of the gaseous component in the etching chamber with a predefined lower threshold, and to stop the reactive ion etching process in the etching chamber when the lower threshold is reached.

Embodiments of the inventive method shall now be described.

If the mask is grown with a homogenous layer thickness on the wafer, this also ensures, with the aid of the method according to the invention, that when producing a plurality of tips all the tips have the same, reproducible height.

It is advantageous when the mask material is an oxide, because the detectable gaseous component can be then oxygen. Numerous sensors for detecting oxygen are available and are known from the prior art, for example lambda sensors, paramagnetic sensors and titania sensors.

Suitable materials from which the nanotips can be formed are Si, W, Ta, Nb and Mo. In one preferred variant of the method according to the invention, the tip material is silicon, and the mask contains or substantially consists of silicon oxide. Silicon tips have advantages in numerous applications. In particular, the use of silicon nanotips is advantageous for applications in sensors, for example in gas sensors, due to the high level of detection sensitivity that can be achieved. Since silicon can be used at the same time as a substrate for producing nanotips, no problems arise in operation, when producing a nanotip product, as a result of different coefficients of thermal expansion. In one variant of the method, low-temperature $SiO_2$ may be used when producing nanotips from metal.

In preferred variants of the method, the gaseous component is detected in the etching chamber with the aid of a detection method which uses a gas chromatograph or a spectrometer. Mass spectrometry, ellipsometry and optical emission spectroscopy are specifically suitable for use in variants of the method according to the invention.

In another advantageous variant of the method, the predefined lower threshold is identical to a detection limit for the gaseous component in the detection method being used. It is therefore advantageous that the gaseous component released when etching the mask layer has as low a detection limit as possible in the atmosphere prevailing in the etching chamber, in order to optimize the duration of the etching process. The factors responsible, in addition to selection of the mask material, are the process gases that are used and selection of the detection technology used for the gaseous component. The lower the smallest detectable concentration, i.e., the lower the detection limit, the smaller the amount of the gaseous component that can no longer be detected, but which is still being released in the etching chamber.

However, the lower threshold can also be set to values greater than the detection limit. For example, it may make sense to take into consideration, when the lower threshold is set in this manner, that after stopping the reactive ion etching process, ions are still available in the etching chamber for a short period, and that the etching reaction ends with a time delay.

The height of the nanotip as well as the pitch can be set using the ratio of the etching rate acting on the mask material to the etching rate acting on the tip material. With the aid of this etching rate ratio, the steepness of the cone can be optimized according to the specific application. In one preferred variant, the ratio of the etching rate acting on the mask material to the etching rate acting on the tip material is 1:5. This is specifically advantageous when electrodes are to be arranged with minimal spacing around the tip in the subsequent application, in order to produce a triode component, for example.

In one preferred variant of the method, the mask is produced with the following steps:

applying a layer consisting of the mask material directly on the tip material;

applying an anti-reflection layer on the mask material;

applying a photoresist layer on the anti-reflection layer;

carrying out a photolithography process to structure the photoresist such that the photoresist remains only at those places where at least one nanotip is to be formed later in the process, carrying out a selective etching process to expose the substrate only at those a places that are not covered by photoresist;

carrying out a selective etching process to remove all the layers except for the mask material and the substrate.

In one variant of the method according to the invention, the layer of the mask material is applied directly onto the tip material by means of a low-temperature vapor deposition method, in particular by means of plasma-enhanced chemical vapor deposition.

BRIEF DESCRIPTION OF DRAWINGS

Further variants shall now be explained with reference to the drawings, in which.

DETAILED DESCRIPTION

FIGS. 2a-2d show a schematic view of one variant of the method according to the invention.

Figure 1:
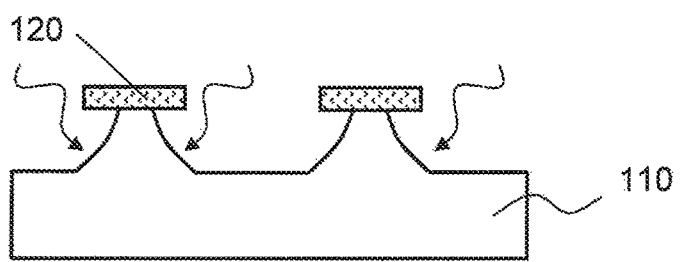
FIG. 1 shows an example, already described in the foregoing, of a prior art method for producing nanotips.
Figure 2A:
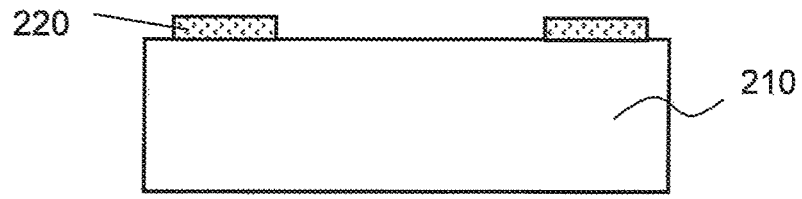
FIGS. 2a-2d show a schematic view of one variant of the method according to the invention for producing nanotips.

FIG. 2a shows a schematic view of a silicon wafer 210 with a mask 220 made of $SiO_2$ applied thereon. Silicon wafer 210 with applied mask 220 made of $SiO_2$ is used as a starting point for an RIE process described below. In one variant of the method according to the invention, silicon wafer 210 is highly p-doped.

Metallic nanotips can also be produced with the aid of the method according to the invention, for example metallic nanotips made of W, Ta, Nb or Mo. The starting point in that case is generally a silicon substrate with a coating of the respective metal, the layer thickness of the coating being equal at least to the intended final height of the nanotips. Masks of silicon oxide or $SiO_2$ can likewise be used to produce metallic nanotips, but are preferably deposited at lower temperatures than when producing silicon nanotips, in order to take account of the respective melting points. Oxide can be successfully deposited at relatively lower temperatures by using a PECVD (plasma-enhanced chemical vapor deposition) method, for example.

Wafer 210 is placed into an etching chamber and subjected to an RIE process in which, in the variant of the method shown here, a gas mixture consisting of $SiCl_4+Cl_2+N_2$ is used.

Figure 2B:
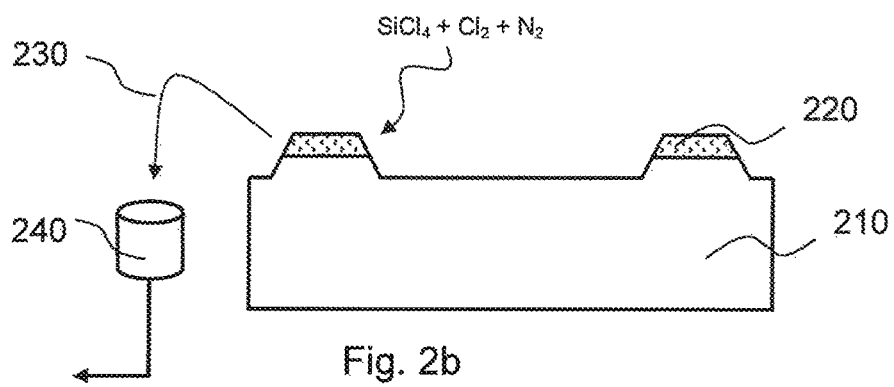

As shown in FIG. 2b, both silicon wafer 210 and SiO$_2$ mask 220 are etched in this case. By setting an appropriate gas mixture, the etching rate ratio of silicon dioxide to silicon is set to 1:5. This results in a truncated cone with the desired pitch being formed. When etching SiO$_2$ mask 220, oxygen 230 is released. The oxygen 230 is detected by an oxygen sensor 240. The reactive ion etching process is carried out in a high-vacuum environment. This is achieved by continuously evacuating the etching chamber, which means that reaction products that ensue remain in the etching chamber for only a very short time. By detecting the oxygen concentration, information is thus obtained about the amount of oxygen being released just before the time of measurement. The sensor passes its measurement result to a controller (not shown here) which is configured to stop the inflow of the etching gas mixture when a predefined threshold for the oxygen concentration has been reached.

Figure 2C:
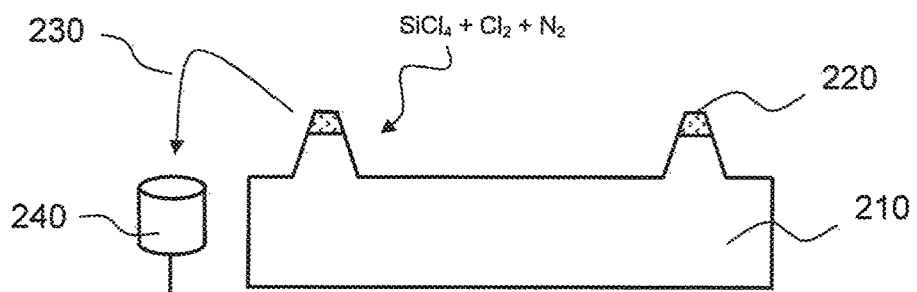

FIG. 2c shows an advanced stage of the etching process. The pitch of the cone becomes steeper the longer the etching process continues. Mask layer 220 has become narrower in the course of the etching process, but is still present. As oxygen is still being released, and detected by oxygen sensor 240, etching gas continues to flow into the etching chamber.

Figure 2D:
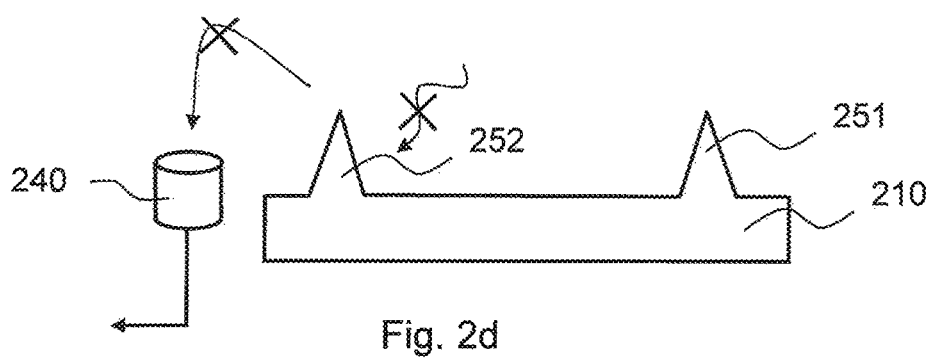

FIG. 2d shows the end of the etching process. What can be seen is silicon wafer 210 with nanotips 251 and 252 formed thereon. The mask has been completely removed, and since no oxygen is released from the Si substrate during etching, no oxygen is detected by oxygen detector 240. The predefined lower threshold has thus been reached, or the concentration has fallen below it, and the flow of etching gas into the etching chamber is stopped.

Figure 3A:
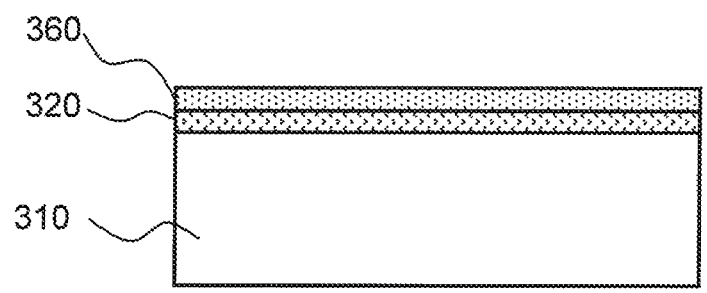
FIGS. 3a-3d show a schematic view of a method for producing a mask on a silicon wafer, to be performed before the steps in FIGS. 2a-2d.

FIGS. 3a to 3d show schematic views of a known sequence of production steps, as an example of a method for producing mask 220 on silicon substrate 210 as shown in FIG. 2a. As shown in FIG. 3a, a first layer 320 of thermal silicon dioxide and a second layer 360 of thermal Si$_3$N$_4$ are deposited on a highly p-doped silicon wafer 310. An organic antireflection coating (ARC) 370 is applied to the second layer 360. A lacquer film structured by means of photolithography is applied to this organic ARC layer 370, thus producing a positive mask, i.e., the mask is applied in the places where the nanotips are later to be produced. An SiO$_2$ mask is likewise used to produce metallic nanotips. In this case, the SiO$_2$ layer is applied using a low-temperature vapor deposition method, such as plasma-enhanced chemical vapor deposition (PECVD), so that the process temperatures are significantly lower than the melting point of the respective metal being used.

Figure 3B:
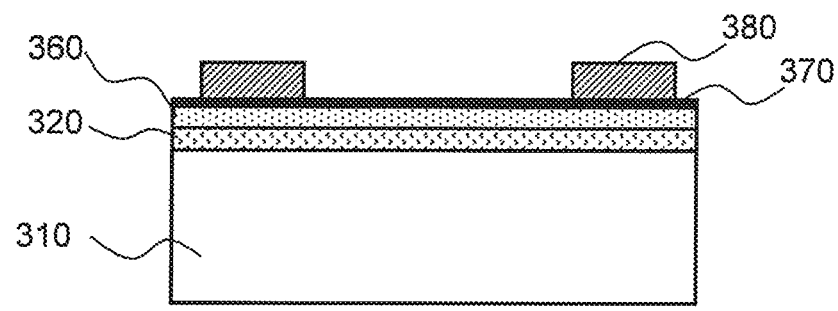
Figure 3C:
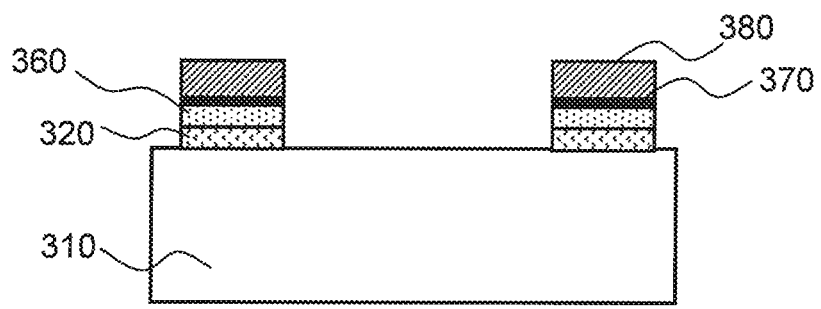

FIG. 3b shows the layer structure after the photolithographic process for producing resist mask 380. In the next step, an etching process is carried out which results in the silicon wafer 310 being exposed wherever there is no resist mask. The result of the etching process is shown in FIG. 3c.

Figure 3D:
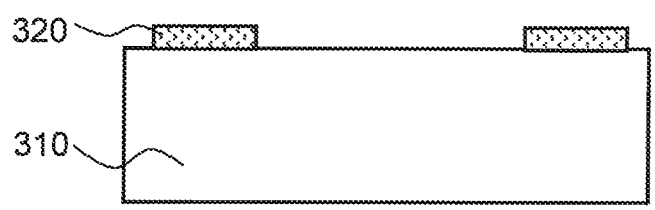

In the last step, which results in the structure shown in FIG. 3d, comprising silicon wafer 310 and SiO$_2$ mask 320, the remaining resist mask 380, the organic ARC layer 370 and the thermal Si$_3$N$_4$ 360 are removed by selective etching.

Figure 4:
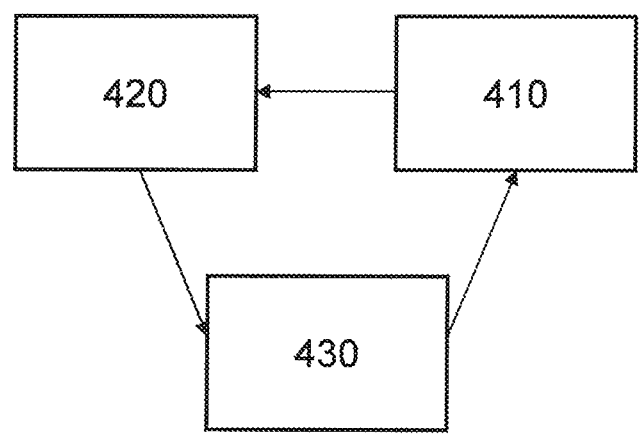
FIG. 4 shows a schematic block diagram of a variant of a method according to the invention.

FIG. 4 shows a schematic block diagram of one variant of a method according to the invention, comprising a system for reactive ion etching. An etching chamber 410 of the system allows a reactive ion etching process to be carried out. A detection device 420 for a gaseous component, which is an oxygen sensor in the variant shown, is configured to detect any oxygen present in the etching chamber and to generate a signal containing information about the amount of oxygen in the etching chamber. Detection device 420 outputs this signal to a controller 430. Controller 430 is configured to start, maintain and stop a reactive ion etching process running in etching chamber 140. Controller 430 compares the information outputted from detection device 420 about the current amount of the gaseous component in the etching chamber with a predefined lower threshold, and stops the reactive ion etching process in the etching chamber when the lower threshold is reached.

The invention claimed is:

1. A method for producing at least one nanotip that comprises a tip having a radius of less than 10 nm from a material, hereinafter called a tip material, said method comprising the steps of:
   providing a substrate which consists of the tip material or comprises said tip material in the form of a coating;
   producing a mask from a mask material, wherein the mask material is selected so that, in a predefined reactive ion etching process, the mask material is removed at a lower etching rate than the tip material,
   carrying out the reactive ion etching process in an etching chamber,
   additionally selecting the mask material such that a gaseous component is released from the mask material during the reactive ion etching process, said gaseous component not being released from the tip material during the reactive ion etching process,
   detecting the gaseous component while the ion etching process is being carried out,
   repeatedly determining during the ion etching process whether an amount of the gaseous component in the etching chamber reaches a predefined lower threshold, said predefined lower threshold set to substantially no detection of the gaseous component, and
   stopping the reactive ion etching process as soon as the lower predefined threshold is reached.

2. The method according to claim 1, wherein the gaseous component is detected by means of a detection method which uses a gas chromatograph or a spectrometer.

3. The method according to claim 1, wherein the predefined lower threshold is a detection limit of the gaseous component in the detection method being used.

4. The method according to claim 1, wherein for a given tip material and mask material, the ratio of the etching rate acting on the mask material to the etching rate acting on the tip material is set to 1:5.

5. The method according to claim 1, wherein the predefined lower limit set to substantially no detection of the gaseous component is a value greater than a lower detection limit of the gaseous component in the detection method used, so that ions that are still available in the etching chamber for a short period time delay after stopping the reactive ion etching process are accounted for in the method.

6. The method according to claim 1, wherein producing the mask comprises the following steps:
   applying a layer of the mask material directly on the tip material forming the substrate;
   applying an anti-reflection layer on the mask material;
   applying a photoresist layer on the anti-reflection layer;
   carrying out a photolithography process to structure the photoresist such that the photoresist remains only at those places where at least one nanotip having a radius of less than 10 nm is to be formed later in the process;
   carrying out a selective etching process to expose the substrate only at those places that are not covered by photoresist; and
   carrying out a selective etching process to remove all the layers except for the mask material and the substrate.

7. The method according to claim 6, wherein the layer of the mask material is applied directly onto the tip material by means of plasma-enhanced chemical vapor deposition.

8. The method according to claim 1, wherein the mask material is an oxide and that the gaseous component is oxygen.

9. The method according to claim 8, wherein the mask material is $SiO_2$ and the tip material is Si.

10. The method according to claim 8, wherein the mask material is $SiO_2$ and the tip material is a metal, and wherein the $SiO_2$ is produced at a temperature lower than the melting point of the metal.

11. The method according to claim 1, wherein the tip material is selected from the group Si, W, Ta, Nb, Mo.

12. The method according to claim 11, characterized in that the mask material is an oxide and that the gaseous component is oxygen.

13. The method according to claim 12, wherein the mask material is an $SiO_2$ and the tip material is Si.

14. The method according to claim 12, wherein the mask material is $SiO_2$ and the tip material is a metal, wherein the $SiO_2$ is produced at a temperature lower than the melting point of the metal.

15. The method according to claim 14, wherein the gaseous component is detected by means of a detection method which uses a gas chromatograph or a spectrometer.

16. The method according to claim 15, wherein the predefined lower threshold is a detection limit of the gaseous component in the detection method being used.

17. The method according to claim 16, wherein for a given tip material and mask material, the ratio of the etching rate acting on the mask material to the etching rate acting on the tip material is set to 1:5.

18. The method according to claim 17, wherein producing the mask comprises the following steps:
  applying a layer of the mask material directly on the tip material forming the substrate;
  applying an anti-reflection layer on the mask material;
  applying a photoresist layer on the anti-reflection layer;
  carrying out a photolithography process to structure the photoresist such that the photoresist remains only at those places where at least one nanotip that comprises a tip having a radius of less than 10 nm is to be formed later in the process;
  carrying out a selective etching process to expose the substrate only at those places that are not covered by photoresist; and
  carrying out a selective etching process to remove all the layers except for the mask material and the substrate.

19. The method according to claim 18, wherein the layer of the mask material is applied directly onto the tip material by means of plasma-enhanced chemical vapor deposition.

* * * * *